US012334383B2

United States Patent
Carducci et al.

(10) Patent No.: US 12,334,383 B2
(45) Date of Patent: Jun. 17, 2025

(54) SUBSTRATE SUPPORT GAP PUMPING TO PREVENT GLOW DISCHARGE AND LIGHT-UP

(71) Applicant: Applied Materials, Inc., Santa Clara, CA (US)

(72) Inventors: James David Carducci, Sunnyvale, CA (US); Kenneth S. Collins, San Jose, CA (US); Michael R. Rice, Pleasanton, CA (US); Kartik Ramaswamy, San Jose, CA (US); Silverst Antony Rodrigues, Bangalore (IN); Yang Yang, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 610 days.

(21) Appl. No.: 17/553,305

(22) Filed: Dec. 16, 2021

(65) Prior Publication Data
US 2023/0197495 A1    Jun. 22, 2023

(51) Int. Cl.
*H01L 21/683* (2006.01)
*H01J 37/32* (2006.01)
*H01L 21/687* (2006.01)

(52) U.S. Cl.
CPC .... *H01L 21/6833* (2013.01); *H01J 37/32642* (2013.01); *H01J 37/32724* (2013.01); *H01J 37/32834* (2013.01); *H01L 21/68735* (2013.01); *H01L 21/68742* (2013.01); *H01J 2237/334* (2013.01)

(58) Field of Classification Search
None
See application file for complete search history.

(56) References Cited

U.S. PATENT DOCUMENTS 6,146,463 A * 11/2000 Yudovsky ............... H01L 21/68
118/728
7,160,392 B2 * 1/2007 Shang ............... H01L 21/68742
156/345.23

(Continued)

FOREIGN PATENT DOCUMENTS

JP    2001196447 A  *  7/2001
JP    2017-174855 A     9/2017

(Continued)

OTHER PUBLICATIONS

International Search Report for PCT/US2022/053029, dated Apr. 28, 2023.

*Primary Examiner* — Sylvia Macarthur
(74) *Attorney, Agent, or Firm* — Moser Taboada

(57) ABSTRACT

Embodiments of substrate supports for use in substrate processing chambers are provided herein. In some embodiments, a substrate support for use in a substrate processing chamber includes: a pedestal having a first side configured to support a substrate and a second side opposite the first side; a plurality of substrate lift pins extending through the pedestal, wherein a plurality of first gaps are disposed between the plurality of substrate lift pins and respective ones of a plurality of substrate lift pin openings in the pedestal; and vacuum lines that extend from the plurality of substrate lift pin openings and that are configured to pump down the plurality of substrate lift pin openings.

20 Claims, 3 Drawing Sheets

(56) References Cited

U.S. PATENT DOCUMENTS

| | | | | |
|---|---|---|---|---|
| 7,241,362 | B2* | 7/2007 | Shimbara | G11B 23/505 |
| | | | | 156/345.55 |
| 8,522,715 | B2* | 9/2013 | Fischer | H01J 37/32449 |
| | | | | 156/915 |
| 10,069,443 | B2* | 9/2018 | Senzaki | H01L 21/6831 |
| 2011/0287631 | A1 | 11/2011 | Yamamoto | |
| 2014/0202635 | A1 | 7/2014 | Yamaguchi et al. | |
| 2014/0265090 | A1 | 9/2014 | Hou | |
| 2017/0352565 | A1 | 12/2017 | Zhang et al. | |
| 2018/0061616 | A1* | 3/2018 | Nichols | H01J 37/32834 |
| 2019/0157130 | A1 | 5/2019 | Lee et al. | |
| 2020/0185248 | A1* | 6/2020 | Sarode Vishwanath | |
| | | | | H01L 21/6833 |
| 2021/0296098 | A1 | 9/2021 | Cho et al. | |
| 2021/0296101 | A1* | 9/2021 | Prouty | H01J 37/32715 |
| 2021/0343512 | A1* | 11/2021 | Parkhe | H01L 21/67126 |
| 2022/0254612 | A1 | 8/2022 | Kimball et al. | |
| 2023/0197495 | A1* | 6/2023 | Carducci | H01J 37/32724 |
| | | | | 156/345.51 |

FOREIGN PATENT DOCUMENTS

| | | |
|---|---|---|
| WO | WO2021158612 A1 | 8/2021 |
| WO | WO2021202136 A1 | 10/2021 |

* cited by examiner

SUBSTRATE SUPPORT GAP PUMPING TO PREVENT GLOW DISCHARGE AND LIGHT-UP

FIELD

Embodiments of the present disclosure generally relate to substrate processing equipment.

BACKGROUND

Substrate processing systems typically include process chambers for performing a desired process, such as an etch process, on one or more substrates disposed therein. Radio frequency (RF) power is often used in etching processes, for example, requiring very high aspect ratio holes to make contacts or deep trenches for laying infrastructure for electrical pathways. RF power can be used for plasma generation and/or for creating bias voltage on a substrate being processed to attract ions from bulk plasma.

Substrate supports are disposed in substrate processing chambers and are configured to support substrates being processed. However, any gaps or cavities in the substrate support that is not under vacuum pressure may be prone to glow discharge and light-up if exposed to plasma or if sufficiently high local electric field is present in the gaps/cavities. Accordingly, the inventors have provided embodiments of improved substrate supports.

SUMMARY

Embodiments of substrate supports for use in substrate processing chambers are provided herein. In some embodiments, a substrate support for use in a substrate processing chamber includes: a pedestal having a first side configured to support a substrate and a second side opposite the first side; a plurality of substrate lift pins extending through the pedestal, wherein a plurality of first gaps are disposed between the plurality of substrate lift pins and respective ones of a plurality of substrate lift pin openings in the pedestal; and vacuum lines that extend from the plurality of substrate lift pin openings and that are configured to pump down the plurality of substrate lift pin openings.

In some embodiments, a process chamber for processing a substrate includes: a chamber body defining a processing volume therein; a substrate support disposed in the chamber body and having an upper surface exposed to the processing volume, the substrate support, comprising: a pedestal having a first side configured to support a substrate and a second side opposite the first side; and a plurality of substrate lift pins extending through the pedestal, wherein a plurality of first gaps are disposed between the plurality of substrate lift pins and respective ones of a plurality of substrate lift pin openings in the pedestal; and a vacuum pump coupled to each of the plurality of first gaps via vacuum lines that extend to the plurality of substrate lift pin openings, the vacuum pump configured to pump down the plurality of first gaps without pumping down the processing volume.

In some embodiments, a process chamber for processing a substrate includes: a chamber body defining a processing volume therein; a substrate support disposed in the chamber body and having an upper surface exposed to the processing volume, wherein the substrate support comprises: a pedestal having a dielectric plate including an electrode and a cooling plate coupled to the dielectric plate; and a plurality of substrate lift pins extending through the dielectric plate and through the cooling plate, wherein a plurality of first gaps are disposed between the plurality of substrate lift pins and respective ones of a plurality of substrate lift pin openings in the dielectric plate and the cooling plate; a vacuum pump coupled to each of the plurality of first gaps and configured to pump down the plurality of first gaps to a first pressure; and a second vacuum pump coupled to the chamber body and configured to pump down the processing volume to a process pressure, wherein the first pressure is less than the process pressure.

In some embodiments, a method of processing a substrate includes pumping down a processing volume of a process chamber to a process pressure; and pumping down a plurality of first gaps disposed about a plurality of substrate lift pins to a first pressure less than the process pressure.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
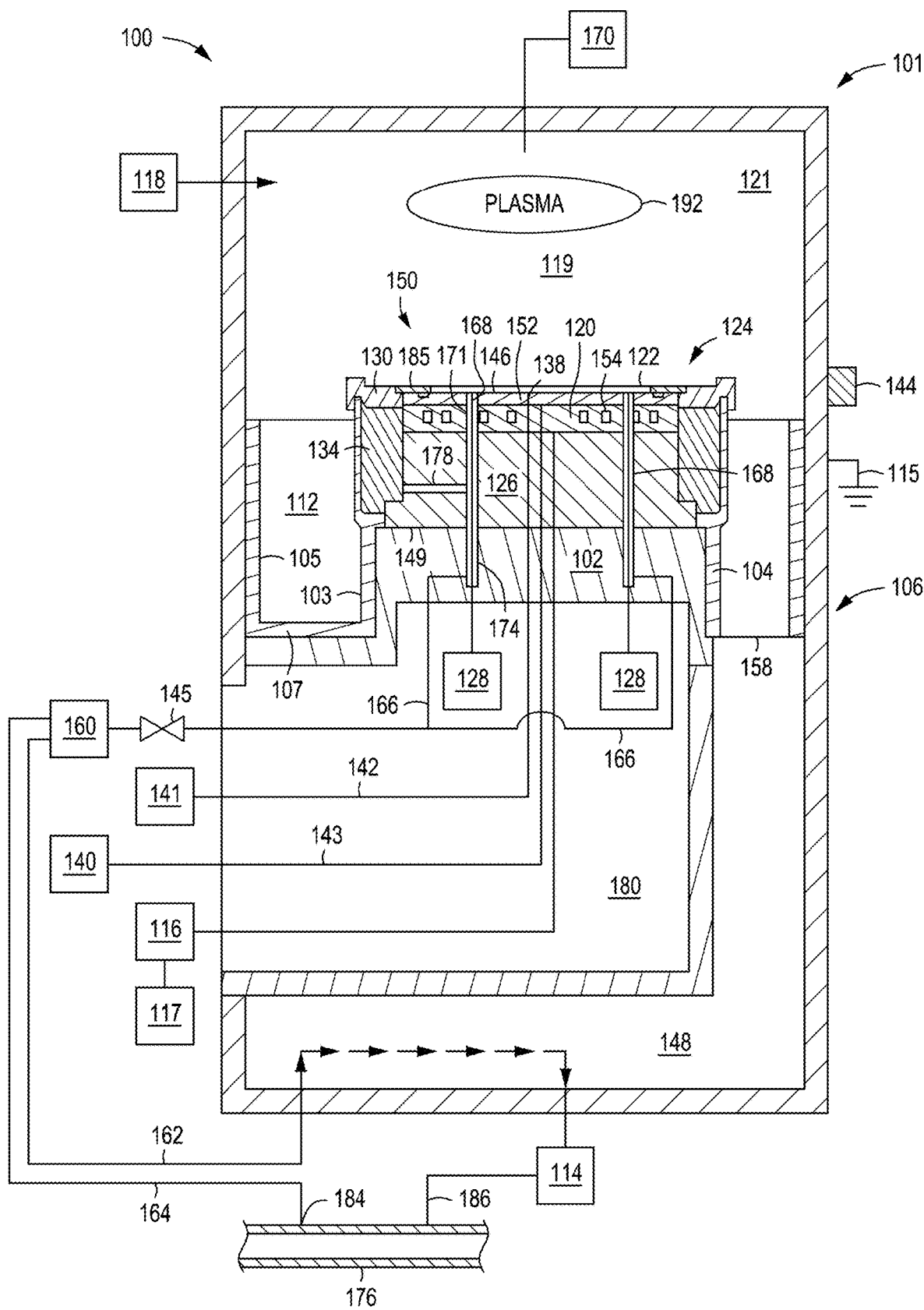
FIG. 1 depicts a schematic cross-sectional side view of a process chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of substrate supports having a dedicated pump for gap pumping to prevent glow discharge and light-up are provided herein. The substrate supports are generally disposed in a process chamber, with an upper surface of the substrate support exposed to a processing volume. The dedicated pump may be coupled to various cavities, or gaps, that may be disposed in the substrate support and configured to pump down the various cavities, for example, separate from a pump configured to pump down the processing volume of the process chamber, to advantageously prevent gas breakdown. The cavities may be gaps between various moving parts of the substrate support, gaps for accommodating thermal expansion between various parts of the substrate support, and the like. For example, the cavities may be gaps between lift pins and lift pin openings. In another example, the cavities may be gaps between power electrodes and insulators surrounding the power electrodes. The dedicated pump for gap pumping advantageously allows for achievement of a lower pressure in the cavities than what could be achieved by using any pumps used for exhausting process chemistry from the process chamber. The dedicated pump for gap pumping also advantageously minimizes back flow of process chemistry from the processing volume into the cavities as compared to using a single pump for exhausting process chemistry and for gap pumping.

FIG. 1 depicts a schematic cross-sectional side view of a process chamber in accordance with at least some embodiments of the present disclosure. In some embodiments, the plasma processing chamber is an etch processing chamber. However, other types of processing chambers configured for different processes can also use or be modified for use with embodiments of the substrate supports described herein.

The process chamber, or chamber 100, may be a vacuum chamber which is suitably adapted to maintain sub-atmospheric pressures within an interior volume 121 during substrate processing. The chamber 100 includes a chamber body 106 covered by a lid 101 which encloses a processing volume 119 located in the upper half of the interior volume 121. The chamber 100 may also include one or more shields (not shown) circumscribing various chamber components to prevent unwanted reaction between such components and ionized process material. The chamber body 106 and lid 101 may be made of metal, such as aluminum. The chamber body 106 may be grounded via a coupling to ground 115.

A substrate support 124 is disposed within the interior volume 121 to support and retain a substrate 122, such as a semiconductor wafer, for example, or other substrate. The substrate support 124 may generally comprise a pedestal 150 disposed on a base plate 102. The pedestal 150 includes a first side 146 configured to support a substrate and a second side 149 opposite the first side 146. An upper surface of the substrate support 124 (e.g., first side 146 of the pedestal 150) is exposed to the processing volume 119. In some embodiments, the pedestal comprises a dielectric plate 152 disposed on and coupled to a cooling plate 120.

The dielectric plate 152 may include one or more chucking electrodes (see one or more chucking electrodes 210 in FIG. 2) configured to electrostatically chuck the substrate 122 to the dielectric plate 152. The one or more chucking electrodes 210 may be monopolar or bipolar. In some embodiments, the substrate support 124 includes one or more process kit components, such as an edge ring 185. In some embodiments, the edge ring 185 is disposed on the pedestal 150 and configured to surround the substrate 122. In some embodiments, the one or more chucking electrodes may also electrostatically chuck the edge ring 185 to the dielectric plate 152.

The cooling plate 120 includes cooling channels 154 configured to circulate a coolant to cool the dielectric plate 152. In some embodiments, the cooling channels 154 are disposed beneath the dielectric plate 152 and the edge ring 185. In some embodiments, the cooling plate 120 is made of an electrically conductive material, for example, aluminum (Al). In some embodiments, the cooling plate 120 is disposed on and coupled to an insulator plate 126. In some embodiments, the insulator plate 126 is disposed on the base plate 102. In some embodiments, the insulator plate 226 is made of aluminum oxide ($Al_2O_3$) or a polymer, such as, polyphenylene sulfide (PPS).

In some embodiments, the base plate 102, together with the chamber body 106, define a lower volume 180 of the chamber 100 below the base plate 102. In some embodiments, the lower volume 180 may be at atmospheric pressure during use. Various conduits may extend to the pedestal 150 to provide, for example, backside gases, process gases, fluids, coolants, power, or the like, to the pedestal 150. In some embodiments, the various conduits may extend through the lower volume 180.

In some embodiments, the various conduits may include conduits for a backside gas supply 141, a chucking power supply 140, a RF plasma power supply 170, and a bias power supply 117. The chucking power supply 140 may be coupled to the one or more chucking electrodes 210 via chucking electrode lines 143. The RF plasma power supply 170 may alternatively, or in addition, provided to the chamber 100 via the lid 101 or upper portion of the chamber body 106. In some embodiments, the bias power supply 117 includes one or more RF bias power sources. In some embodiments, RF energy supplied by the RF plasma power supply 170 may have a frequency of about 400 kHz to over 40 MHz. In some embodiments, the RF plasma power supply 170 and the bias power supply 117 are coupled to the pedestal 150 via respective RF match networks (only RF match network 116 shown). In some embodiments, the substrate support 124 may alternatively include AC, DC, or RF bias power. In some embodiments, the AC, DC, or RF bias power may be pulsed.

The substrate support 124 includes a plurality of substrate lift pins 168 extending through the substrate support 124 and configured to selectively raise or lower the substrate 122. A plurality of first gaps 174 are disposed between the plurality of substrate lift pins 168 and respective ones of a plurality of substrate lift pin openings 171 in the substrate support 124. In some embodiments, the substrate lift pin openings 171 extend through the dielectric plate 152 and the cooling plate 120. A plurality of substrate lift assemblies 128 are coupled to respective ones of the plurality of substrate lift pins 168 and configured to selectively raise or lower the plurality of substrate lift pins 168. In some embodiments, the plurality of substrate lift pins 168 comprise three lift pins that are disposed symmetrically about the substrate support 124.

A vacuum pump 160 is coupled to each of the plurality of first gaps 174 via vacuum lines 166 that extend from the plurality of substrate lift pin openings 171 to the vacuum pump 160. In some embodiments, the vacuum pump 160 is coupled to each of the plurality of first gaps 174 and configured to pump down the plurality of first gaps 174 to a first pressure. In some embodiments, the first pressure is less than about 10 mTorr. In some embodiments, the first pressure is less than about 1 mTorr. A control valve 145 may be coupled to the vacuum lines 166 to control pressure in the vacuum lines 166. In use, the vacuum pump 160 is configured to pump down the plurality of first gaps without pumping down the processing volume 119. The vacuum lines 166 may comprise any combination of conduits disposed outside of the substrate support 124 and channels formed through the substrate support 124 to the gaps or cavities that are to be pumped down.

In some embodiments, the substrate support 124 may include a liner 104 disposed about, or surrounding, the pedestal 150. In some embodiments, one or more of the liner 104 and the base plate 102 are grounded during use. In some embodiments, the liner 104 comprises an inner wall 103 and an outer wall 105 defining an annular channel 112 therebetween. In some embodiments, the inner wall 103 and the outer wall 105 are coupled to a lower plate 107 of the liner 104.

The chamber 100 includes a second vacuum pump 114 fluidly coupled to the processing volume 119 to exhaust the processing volume 110. In some embodiments, the lower plate 107 includes one or more pump ports 158 coupled to the second vacuum pump 114 for exhausting the processing volume 119. The pressure inside the processing volume 119 may be regulated by adjusting a throttle valve of the second vacuum pump 114.

The interior volume 121 may include a second volume 148 fluidly coupled to the processing volume 119. In some embodiments, the one or more pump ports 158 may extend to the second volume 148. In some embodiments, the second volume 148 is disposed below the substrate support 124 and upstream from the second vacuum pump 114. In some embodiments, the lower volume 180 is disposed between the processing volume 119 and the second volume 148. In some embodiments, the second vacuum pump 114 is coupled to the chamber body 106 adjacent the second volume 148.

In use, a method of processing a substrate includes pumping down the processing volume 119 of the process chamber 100 to a process pressure, and pumping down the plurality of first gaps 174 disposed about the plurality of substrate lift pins 168 to the first pressure, where the first pressure is less than the process pressure. For example, the second vacuum pump 114 is configured to pump down the processing volume 119 to the process pressure, and the vacuum pump 160 is configured to pump down the plurality of first gaps 174 to the first pressure.

In some embodiments, the vacuum pump 160 exhausts to the second volume 148 via exhaust line 162. In such embodiments, the second vacuum pump 114 may exhaust the second volume 148, including the contents of the exhaust of the vacuum pump 160. In some embodiments, the second vacuum pump 114 exhausts to a rough line 176. In some embodiments, the vacuum pump 160 exhausts to a rough line 176 via exhaust line 164 independent of the second vacuum pump 114. For example, the vacuum pump 160 may exhaust into the rough line 176 at a first location 184 and the second vacuum pump 114 exhausts into the rough line 176 at a second location 186 different than the first location 184. In another example, the vacuum pump 160 and the second vacuum pump 114 may exhaust to a T-junction and the exhaust from both the vacuum pump 160 and the second vacuum pump 114 may flow from the T-junction to a single location in the rough line 176.

In some embodiments, the process kit components include a quartz ring 130 is disposed about the pedestal 150, for example, about the dielectric plate 152 and the edge ring 185. The quartz ring 130 may promote process uniformity of the substrate 122. In some embodiments, the quartz ring 130 includes a notched upper inner edge configured to support an outer edge of the edge ring 185. In some embodiments, a lower edge ring 134 is disposed about the pedestal 150. In some embodiments, the lower edge ring 134 is disposed between the pedestal 150 and the liner 104. In some embodiments, the lower edge ring 134 is disposed below the quartz ring 130. In some embodiments, the lower edge ring 134 is made of quartz. In some embodiments, a second edge ring 218 may be disposed on the quartz ring 130 and surrounding the pedestal 150. The second edge ring 218 may be made of a similar material as the edge ring 185.

In some embodiments, a third gap (e.g., third gap 224 in FIG. 2) is disposed between the lower edge ring 134 and the pedestal 150. The third gap 224 allows for thermal expansion of one or more components of the pedestal 150. In some embodiments, the vacuum pump 160 is fluidly coupled to the third gap 224 to exhaust the third gap 224. In some embodiments, the third gap 224 is fluidly coupled to the vacuum pump 160 via a channel 178 extending from one or more of the plurality of first gaps 174 to the third gap 224. In some embodiments, the channel 178 is disposed in the insulator plate 126. In some embodiments, the channel 178 extends radially outward from the first gap 174 to the third gap 224. Pumping down the third gap 224 advantageously reduces or prevents glow up and light up in the third gap 224. By pumping down the third gap 224, the third gap 224 can be made larger, advantageously reducing RF coupling between the pedestal 150 and components disposed about the pedestal 150, for example, the lower edge ring 134. In some embodiments, the lower edge ring 134 may include a channel (not shown) extending from the third gap 224 to a fourth gap (e.g., fourth gap 304 shown in FIG. 3) between the liner 104 and the lower edge ring 134 so that the vacuum pump 160 can pump down the fourth gap. As such, in some embodiments, a singular pump (e.g., vacuum pump 160) can pump down various gaps or cavities disposed in the substrate support 124. In other embodiments, a plurality of vacuum pumps may be used to pump down various gaps or cavities disposed in the substrate support 124.

In some embodiments, the pedestal 150 includes gas distribution channels 138 extending from a lower surface of the pedestal 150 (e.g., bottom surface of the insulator plate 126) to various openings in an upper surface of the pedestal 150. The gas distribution channels 138 are configured to provide backside gas, such as nitrogen (N) or helium (He), to the top surface of the pedestal 150 to act as a heat transfer medium. The gas distribution channels 138 are in fluid communication with the backside gas supply 141 via gas conduit 142 to control the temperature and/or temperature profile of the pedestal 150 during use. In some embodiments, the gas distribution channels 138 are configured to provide gas pressure for heat transfer and temperature control of the edge ring 185 independently from a temperature of the dielectric plate 152. Backside gas that enters the plurality of first gaps 174 may be pumped out by the vacuum pump 160.

The processing volume 119 is also coupled to and in fluid communication with a process gas supply 118 which may supply one or more process gases to the chamber 100 for processing a substrate disposed therein. In some embodiments, the process gas supply 118 may supply one or more process gases to the processing volume 119 via a showerhead (not shown) for more uniform gas distribution.

The chamber 100 includes a slit valve 144 to facilitate transferring the substrate 122 into and out of the interior volume 121. In some embodiments, a transfer robot (not shown) is configured to transfer the substrate 122. The transfer robot may also advantageously be configured to transfer the edge ring 185 into and out of the interior volume 121 for replacement. The slit valve 144 may be coupled to the lid 101 or chamber body 106.

In operation, for example, a plasma 192 may be created in the processing volume 119 to perform one or more processes. The plasma 192 may be created by coupling power from a plasma power source (e.g., RF plasma power supply 170) to a process gas via one or more electrodes near or within the processing volume 119 to ignite the process gas and create the plasma 192. A bias power may be provided from a bias power supply (e.g., bias power supply 117) to the pedestal 150 to attract ions from the plasma 192 towards the substrate 122. The bias power supply 117 may supply bias power to the edge ring 185 and the dielectric plate 152. For example, the bias power supply 117 may comprise a single power supply that is shared by both the edge ring 185 and the dielectric plate 152.

Figure 2:
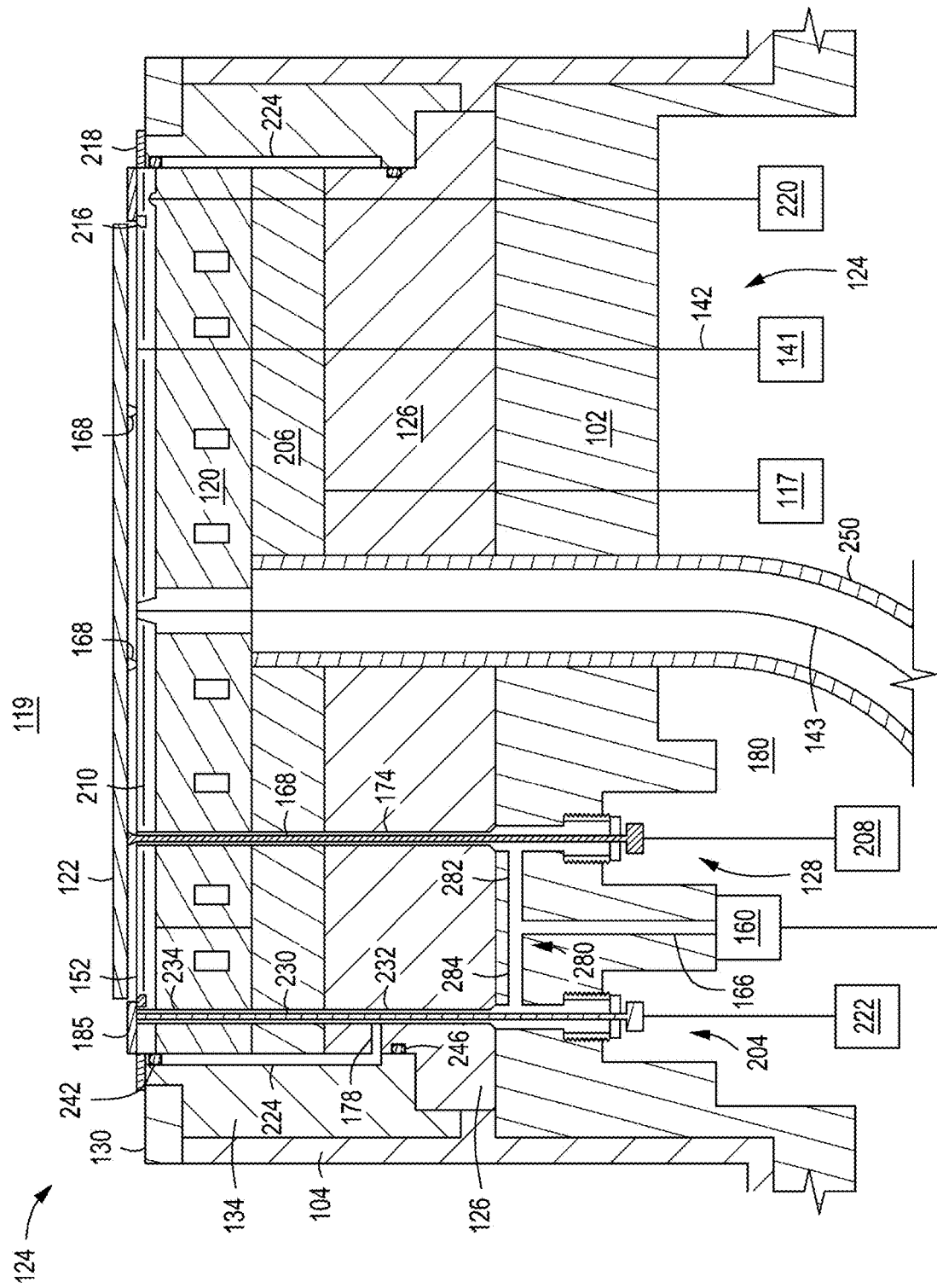
FIG. 2 depicts a schematic cross-sectional side view of a substrate support in accordance with at least some embodiments of the present disclosure.

FIG. 2 depicts a schematic cross-sectional side view of a substrate support in accordance with at least some embodiments of the present disclosure. In some embodiments, a plurality of process kit lift pins 230 extend through the substrate support 124 and configured to selectively raise or lower a process kit component, for example the edge ring 185. The plurality of process kit lift pins 230 are coupled to process kit lift assemblies 204 for raising or lowering the process kit component. In some embodiments, the plurality of process kit lift pins 230 comprise three lift pins that are disposed symmetrically about the substrate support 124. The substrate lift assemblies 128 include a plurality of first actuators 208. The process kit lift assemblies 204 include a plurality of second actuators 222.

The plurality of process kit lift pins 230 are generally disposed radially outward of the plurality of substrate lift pins 168. A plurality of second gaps 232 are disposed between the plurality of process kit lift pins 230 and respective ones of a plurality of process kit lift pin openings 234. In some embodiments, the vacuum pump 160 is coupled to the each of the plurality of second gaps 232 and configured to pump down the plurality of second gaps 232 to a pressure of about 10 mTorr or less. In some embodiments, the plurality of substrate lift pins 168 and the plurality of process kit lift pins 230 are aligned along a common radius of the pedestal 150. In some embodiments, the channel 178 extends from one or more of the plurality of second gaps 232 to the third gap 224. In some embodiments, the third gap 224 is sealed from the processing volume 119. For example, in some embodiments, a first o-ring 242 and a second o-ring 246 are disposed between the lower edge ring 134 and the pedestal 150, with the third gap 224 disposed therebetween.

In some embodiments, the vacuum pump 160 is disposed in the lower volume 180. In some embodiments, the vacuum pump 160 is coupled to the base plate 102. In some embodiments, the vacuum pump 160 is disposed between one of the substrate lift assemblies 128 and one of the process kit lift assemblies 204. In some embodiments, the vacuum lines 166 include one or more junctions 280 in the substrate support 124 that split the vacuum lines 166 into a first vacuum line 282 extending to one of the plurality of first gaps 174 and a second vacuum line 284 extending to one of the plurality of second gaps 232. In some embodiments, the one or more junctions 280 are formed in the base plate 102. In some embodiments, the vacuum lines 166 extend to sidewalls of the plurality of substrate lift pin openings 171. In some embodiments, the vacuum lines 166 extend to sidewalls of the plurality of process kit lift pin openings 234.

The edge ring 185 may advantageously extend a process environment beyond a diameter of the substrate 122. However, the plasma 192 may extend into any gap between the edge ring 185 and the substrate 122 causing degradation of the dielectric plate 152. In some embodiments, an insert ring 216 is disposed in an annular groove on an upper surface of the dielectric plate 152 to protect the dielectric plate 152 from degradation. In some embodiments, the insert ring 216 is separate from the edge ring 185. In some embodiments, the insert ring 216 is formed with the edge ring 185. In some embodiments, the edge ring 185 and the insert ring 216 may be made of silicon (Si), silicon nitride (SiN), silicon carbide (SiC), silicon oxide ($SiO_2$), or quartz. In some embodiments, the edge ring 185 is made of a different material than the insert ring 216.

In some embodiments, at least some of the various conduits provided to the substrate support 124 may be disposed in a facilities cable 250. For example, the chucking electrode lines 143 may extend through the facilities cable 250 In some embodiments, the facilities cable 250 extends through the lower volume 180 to the substrate support 124. In some embodiments, the pedestal 150 includes an RF plate 206 disposed between the cooling plate 120 and the insulator plate 126. In some embodiments, the RF plate 206 is made of a metal material, for example, aluminum. The RF plate 206 is generally coupled to the bias power supply 117 to provide RF bias power to the pedestal 150. In some embodiments, the substrate support 124 includes a temperature probe 220 configured to measure a temperature of the dielectric plate 152.

Figure 3:
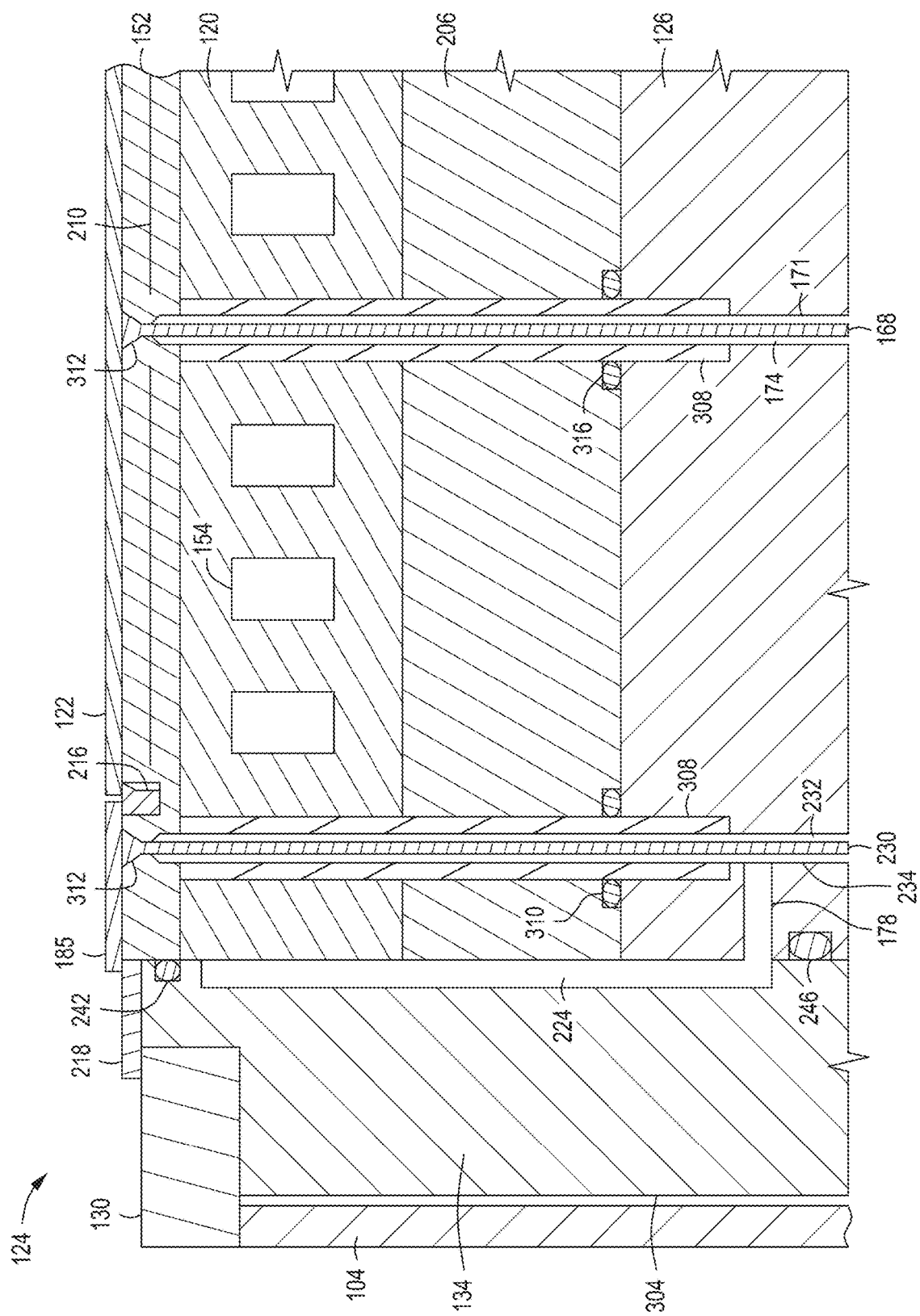
FIG. 3 depicts a cross-sectional side view of a portion of a substrate support in accordance with at least some embodiments of the of present disclosure.

FIG. 3 depicts a cross-sectional side view of a portion of a substrate support 124 in accordance with at least some embodiments of the of present disclosure. In some embodiments, an insulator sleeve 308 is disposed in each of the plurality of substrate lift pin openings 171 and surrounds each of the plurality of substrate lift pins 168. The plurality of first gaps 174 extend between each of the insulator sleeve 308 and respective ones of the plurality of substrate lift pins 168. In some embodiments, the insulator sleeve 308 is made of a polymer material and is configured to reduce or prevent arcing, glow discharge, or light-up in the plurality of first gaps 174. In some embodiments, an insulator sleeve 308 is disposed in each of the plurality of process kit lift pin openings 234 and surrounds each of the plurality of process kit lift pins 230 with the plurality of second gaps 232 extending therebetween. In some embodiments, a third o-ring 310 is disposed about each of the plurality of process kit lift pins 230 to provide a seal at an interface between the RF plate 206 and the insulator plate 126. In some embodiments, a fourth o-ring 316 is disposed about each of the plurality of substrate lift pins 168 to provide a seal at an interface between the RF plate 206 and the insulator plate 126.

In use, when the substrate 122 is disposed on or electrostatically chucked to the dielectric plate 152, the substrate 122 provides a primary seal, separating the processing volume 119 from the plurality of first gaps 174 and the plurality of second gaps 232. In some embodiments, the plurality of substrate lift pins 168 and the plurality of process kit lift pins 230 have an upper portion 312 that tapers outward to provide a secondary seal with the pedestal 150 when in a lower position, further reducing process chemistry and/or substrate heat-transfer or cooling gases from inadvertently entering gaps in the substrate support 124.

While the foregoing is directed to embodiments of the present disclosure, other and further embodiments of the disclosure may be devised without departing from the basic scope thereof.

The invention claimed is:

1. A substrate support for use in a substrate processing chamber, comprising:
   a pedestal having a first side configured to support a substrate and a second side opposite the first side;
   a plurality of substrate lift pin openings extending through the pedestal from the first side to the second side;
   a plurality of substrate lift pins extending through the plurality of substrate lift pin openings, wherein a plurality of first gaps are disposed between the plurality of substrate lift pins and respective sidewalls of the plurality of substrate lift pin openings; and
   vacuum lines that extend from the sidewalls of the plurality of substrate lift pin openings and that are configured to pump down the plurality of substrate lift pin openings, wherein the vacuum lines form a T-junction in the pedestal, and wherein the vacuum lines are directly exposed to the plurality of substrate lift pins.

2. The substrate support of claim 1, further comprising a vacuum pump coupled to the vacuum lines to pump down the plurality of substrate lift pin openings.

3. The substrate support of claim 1, further comprising a plurality of process kit lift pins extending through the pedestal and disposed radially outward of the plurality of substrate lift pins, wherein a plurality of second gaps are disposed between the plurality of process kit lift pins and respective ones of a plurality of process kit lift pin openings, and wherein the vacuum lines extend to sidewalls of the plurality of process kit lift pin openings and are configured to pump down the plurality of second gaps.

4. The substrate support of claim 3, wherein the vacuum lines include junctions formed within the substrate support that split the vacuum lines into a first exhaust line extending to one of the plurality of first gaps and a second exhaust line extending to one of the plurality of second gaps.

5. The substrate support of claim 1, wherein the pedestal includes a dielectric plate having an electrode embedded therein, and a cooling plate coupled to the dielectric plate, and wherein the cooling plate includes cooling channels configured to circulate a coolant.

6. The substrate support of claim 1, further comprising:
a lower edge ring disposed about the pedestal and forming a third gap between the lower edge ring and the pedestal; and
a channel extending from at least one of the plurality of first gaps to the third gap such that the vacuum lines are configured to pump down the plurality of first gaps and the third gap.

7. The substrate support of claim 6, wherein the pedestal includes an insulator plate coupled to a cooling plate, wherein the channel is disposed in the insulator plate.

8. The substrate support of claim 1, wherein the plurality of substrate lift pins have an upper portion that tapers outward to provide a seal with the pedestal when the plurality of substrate lift pins are in a lower position.

9. The substrate support of claim 1, wherein the plurality of substrate lift pins are coupled to a plurality of first actuators.

10. A process chamber for processing a substrate, comprising:
a chamber body defining a processing volume therein;
a substrate support disposed in the chamber body and having an upper surface exposed to the processing volume, the substrate support, comprising:
a pedestal having a first side configured to support a substrate and a second side opposite the first side; and
a plurality of substrate lift pins extending through the pedestal, wherein a plurality of first gaps are disposed between the plurality of substrate lift pins and respective ones of a plurality of substrate lift pin openings in the pedestal;
a lower edge ring disposed about the pedestal and defining a second gap therebetween, wherein the second gap is fluidly coupled to one or more of the plurality of first gaps; and
a vacuum pump coupled to each of the plurality of first gaps via vacuum lines that extend to the plurality of substrate lift pin openings, the vacuum pump configured to pump down the plurality of first gaps without pumping down the processing volume.

11. The process chamber of claim 10, further comprising a second vacuum pump fluidly coupled to the processing volume and configured to pump down the processing volume.

12. The process chamber of claim 11, wherein the chamber body defines a second volume disposed below the substrate support and fluidly coupled to the processing volume, wherein the second volume is upstream from the second vacuum pump.

13. The process chamber of claim 12, wherein the vacuum pump exhausts into the second volume.

14. The process chamber of claim 11, further comprising a rough line, and wherein the vacuum pump exhausts into the rough line at a first location and the second vacuum pump exhausts into the rough line at a second location different than the first location.

15. A process chamber for processing a substrate, comprising:
a chamber body defining a processing volume therein;
a substrate support disposed in the chamber body and having an upper surface exposed to the processing volume, wherein the substrate support comprises:
a pedestal having a dielectric plate including an electrode and a cooling plate coupled to the dielectric plate; and
a plurality of substrate lift pins extending through the dielectric plate and through the cooling plate, wherein a plurality of first gaps are disposed between the plurality of substrate lift pins and respective ones of a plurality of substrate lift pin openings in the dielectric plate and the cooling plate;
an insulator sleeve disposed in each of the plurality of substrate lift pin openings and about each of the plurality of substrate lift pins, wherein the insulator sleeve abuts an outermost sidewall of each respective one of the plurality of substrate lift pin openings;
a first vacuum pump coupled to each of the plurality of first gaps and configured to pump down the plurality of first gaps to a first pressure; and
a second vacuum pump coupled to the chamber body and configured to pump down the processing volume to a process pressure, wherein the first pressure is less than the process pressure.

16. The process chamber of claim 15, wherein the first vacuum pump exhausts to a second volume upstream of the second vacuum pump or to a rough line independent of the second vacuum pump.

17. The process chamber of claim 15, further comprising a plurality of process kit lift pins extending through the pedestal and disposed radially outward of the plurality of substrate lift pins, wherein a plurality of second gaps are disposed between the plurality of process kit lift pins and respective ones of a plurality of process kit lift pin openings, and wherein the first vacuum pump is coupled to the each of the plurality of second gaps and configured to pump down the plurality of second gaps.

18. The process chamber of claim 15, further comprising a lower edge ring disposed about the dielectric plate, wherein a third gap is disposed between the lower edge ring and the dielectric plate, and wherein the first vacuum pump is fluidly coupled to the third gap via a channel.

19. The process chamber of claim 18, further comprising:
a first o-ring and a second o-ring disposed between the lower edge ring and the pedestal, and wherein the third gap is disposed between the first o-ring and the second o-ring.

20. The process chamber of claim 15, wherein the chamber body defines a lower volume disposed below the substrate support, wherein the first vacuum pump is disposed in the lower volume.

* * * * *